United States Patent
Kim et al.

(10) Patent No.: US 8,008,677 B2
(45) Date of Patent: Aug. 30, 2011

(54) LIGHT EMITTING DEVICE AND FABRICATION METHOD THEREOF AND LIGHT EMITTING SYSTEM USING THE SAME

(75) Inventors: Geun-Ho Kim, Seoul (KR); Ki-Chang Song, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 639 days.

(21) Appl. No.: 12/165,282

(22) Filed: Jun. 30, 2008

(65) Prior Publication Data

US 2008/0290820 A1 Nov. 27, 2008

Related U.S. Application Data

(62) Division of application No. 11/106,188, filed on Apr. 13, 2005, now Pat. No. 7,408,203.

(30) Foreign Application Priority Data

Apr. 17, 2004 (KR) .................................. 2004-26432

(51) Int. Cl.
*H01L 33/00* (2010.01)
(52) U.S. Cl. .............................. 257/98; 257/99; 257/100
(58) Field of Classification Search ............. 257/98–100
See application file for complete search history.

(56) References Cited

U.S. PATENT DOCUMENTS

2005/0121686 A1* 6/2005 Keller et al. .................... 257/99

FOREIGN PATENT DOCUMENTS

| JP | 61043466 | 3/1986 |
|---|---|---|
| JP | 61202484 | 9/1986 |
| JP | 11298041 | 10/1999 |
| JP | 11354836 | 12/1999 |
| JP | 2000106458 | 4/2000 |

* cited by examiner

*Primary Examiner* — Samuel Gebremariam

(74) *Attorney, Agent, or Firm* — Lee, Hong, Degerman, Kang & Waimey

(57) ABSTRACT

A light emitting device comprises a light emitting element having a first electrode and a second electrode, and a semiconductor member having a cavity in a principal surface thereof, inside which the light emitting element is mounted, and electrically connected to the light emitting element, wherein the semiconductor member is constructed as a voltage regulating diode for stabilizing a voltage supplied from the exterior. As a result, the light emitting element can be protected from a static electricity or a surge voltage flowed therein from the exterior, the entire size of the system can be remarkably reduced so as to simplify a structure thereof, and heat generated from the system can be effectively discharged to the exterior. In addition, by providing a reflection portion in the cavity, light emitted from the light emitting element can be efficiently condensed.

20 Claims, 6 Drawing Sheets

LIGHT EMITTING DEVICE AND FABRICATION METHOD THEREOF AND LIGHT EMITTING SYSTEM USING THE SAME

CROSS-REFERENCE TO RELATED APPLICATIONS

This application is a divisional of application Ser. No. 11/106,188, filed Apr. 13, 2005, now U.S. Pat. No. 7,408,203, which pursuant to 35 U.S.C. §119(a) claims the benefit of Korean Patent Application No. 26432/2004, filed on Apr. 17, 2004, which is hereby incorporated by reference as if fully set forth herein.

BACKGROUND OF THE INVENTION

1. Field of the Invention

The present invention relates to a light emitting device and a fabrication method thereof and a light emitting system using the same, and particularly, to a light emitting device of which construction can be simplified, size can become smaller, and efficiency of condensation and radiation can be improved, and a fabrication method thereof and a light emitting system using the same.

2. Description of the Conventional Art

In general, a light emitting element was used simply as a signal display device. Recently, the light emitting element has been actively researched as a light source having various wavelengths and energy of many systems. The light emitting elements which have been frequently used include a laser diode (LD) and a light emitting diode (LED). The LD is being used as a light source in a light communication field, while the LED is gradually being applied to various fields as a lighting device or a backlight of an LCD (Liquid Crystal Display) device as well as a general display device.

Especially, the LED can be driven by a relatively low voltage and achieve high energy efficiency, so as to obtain a low heat generation and prolonged life span. In addition, there have come up with techniques capable of allowing a white light which was hard to embody in the conventional art to have a high brightness by using the LED. As a result, the LED is expected as a significant technique to substitute most lighting devices which have currently used.

FIG. 1 is a sectional view showing a general light emitting diode (LED) 10. As shown in the drawing, a buffer layer 12, an n-contact layer 13, an activation layer 14, and a p-contact layer 15 are sequentially deposited on a transparent substrate 11 make of such as a sapphire, an n-GaAs, or the like, by a chemical vapor deposition method. A MESA etching is carried out such that the n-contact layer 13 is exposed by a lithography process and a dry/wet etching process. Thereafter, a current diffusion layer 16 which is constructed to facilitate a light transmission is deposited on the formed structure, and parts to form electrodes are patterned. Afterwards, a p-electrode 17 and an n-electrode 18 are formed, respectively, on the exposed p-contact layer 15 and the n-contact layer 13. Here, a p-cladding layer and an n-cladding layer may be further formed at upper and lower portions of the activation layer 14.

Such constructed LED emits light by applying a voltage to the p-electrode 17 and the n-electrode 18. Here, when the voltage is applied, a hole and an electron are injected into the p-electrode 17 and the n-electrode 18. The injected hole and electron are re-coupled in the activation layer 14, thereby discharging light to the exterior.

In the LED or the LD having the similar structure thereto, heat is generated when the light is discharged to the exterior. If this heat is accumulated in the element, it is disadvantageous to degrade characteristics of the element and shorten its life span. Therefore, sub-mounts and radiation plates are designed and used for the light emitting element such as the LED or LD used for an optical communication or lighting.

The LED, as the light emitting element having the structure shown in FIG. 1, is joined to a flat type sub-mount with an electrode, and accordingly an electrode pattern formed on the sub-mount is connected to an electrode of the LED using a wire bonding technique. Afterwards, when the radiation plate is further joined to the lower portion of the sub-mount, the heat generated from the light emitting element can be effectively discharged outwardly.

However, in a general flat type sub-mount, when a thickness of a substrate is reduced under a predetermined thickness, because the substrate physically becomes fragile, its thickness should be maintained more than a predetermined value. As a result, because the heat generated from the light emitting element is transferred to the radiation plate via the thick sub-mount so as to cause a degradation of the element. Moreover, because the light emitting element is joined to the flat type sub-mount, light is scattered so as to lower light focusing efficiency.

Recently, on the other hand, researches for increasing stability of the light emitting elements have recently been carried out. Especially, in the light emitting element applied to a certain equipment requiring reliability, a separate voltage regulating device is connected to the light emitting element in order to provide against inflow of static electricity or a surge voltage inward the electrode of the light emitting element, thereby constructing a light emitting element package. That is, when the static electricity or the surge voltage is inputted inward the electrode of the light emitting element, a transient current flows in the light emitting element, and accordingly a light emitting element system may be destroyed. As a result, the voltage regulating device such as a zener diode is connected to the light emitting element in parallel.

The zener diode is such a device using a zener breakdown. Here, in fabricating the diode, when an impurity is in a very high concentration, a width of a space charge region becomes narrower, and thusly a strong electric field is generated even in a reverse voltage. This generated strong electric field decomposes a shared combination of lattice into a plurality of free electrons and holes. As a result, the zener diode reduces resistance and allows a remarkable reverse current to flow without a change of voltage. Therefore, when the zener diode having a predetermined breakdown voltage is connected in parallel to the electrode of the light emitting element in a reverse direction, even if high static electricity or surge voltage flows inwardly in an instant, a stable voltage is maintained so as to remarkably relieve an impact on the light emitting element system.

However, in the conventional art, after joining the light emitting element to the flat type sub-mount and the radiation plate, the light emitting element is connected to a constant voltage element such as the zener diode through a separate wire bonding process so as to fabricate the light emitting element package, whereby it is difficult to construct the element, increase fabricating costs thereby, and lower a yield thereof.

Furthermore, when a light emitting device having the light emitting element therein is constructed, many numbers of constant voltage elements must be separately connected to the light emitting device. As a result, its structure becomes complicated and processes thereof get difficult, thereby resulting in increasing costs.

SUMMARY OF THE INVENTION

Therefore, an object of the present invention is to provide a light emitting device of which construction is simplified, entire size can become smaller, and efficiency of condensation and radiation can be improved, and a fabrication method thereof and a light emitting system using the same.

To achieve these and other advantages and in accordance with the purpose of the present invention, as embodied and broadly described herein, there is provided a light emitting device comprising a light emitting element having first and second electrodes, and a semiconductor member having a cavity in a principal surface thereof, inside which the light emitting element is mounted, and electrically connected to the light emitting element.

According to the present invention, there is also provided a light emitting system comprising: a light emitting device including the light emitting element having the first and second electrode, and the semiconductor member having the cavity in a principal surface thereof, inside which the light emitting element is mounted, and electrically connected to the light emitting element, wherein the semiconductor member is a voltage regulating diode having at least two semiconductor regions electrically connected to the first and second electrodes on the principal surface thereof; a stem portion in which the light emitting device is mounted, and having a pair of lead frames electrically connected to the first and second electrodes and to the semiconductor regions; and a cap portion for covering the stem portion to seal the light emitting device.

According to the present invention, there is provide a method for fabricating the light emitting device comprising the steps of: forming a cavity in a principal surface of a semiconductor substrate; forming at least one impurity diffusion region on the principal surface, thereby forming a plurality of semiconductor regions; forming an insulating layer all over the principal surface and patterning contact holes on parts of the insulating layer formed, and accordingly exposing two regions among the plurality of semiconductor regions; forming a pair of connection electrodes which are extendedly-formed upwardly from a bottom surface of the cavity to an upper portion of the principal surface along a side wall of the cavity in order to fill up the contact holes, for electrically connecting the two exposed semiconductor regions to a light emitting element to be mounted later and for being electrically connected to external components; and connecting the light emitting element to the pair of connection electrodes so as to position the light emitting element in the cavity.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a light emitting device according to the present invention will be described in detail in accordance with embodiments shown in the attached drawings.

There may exist many embodiments for the light emitting device according to the present invention, and the preferred embodiment therefor will be explained.

Figure 1:
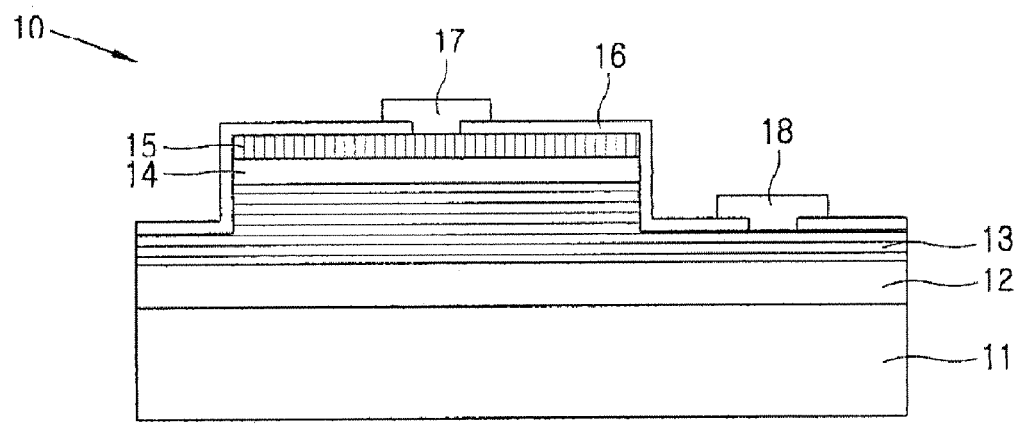
FIG. 1 is a sectional view showing a general light emitting diode.
Figure 2:
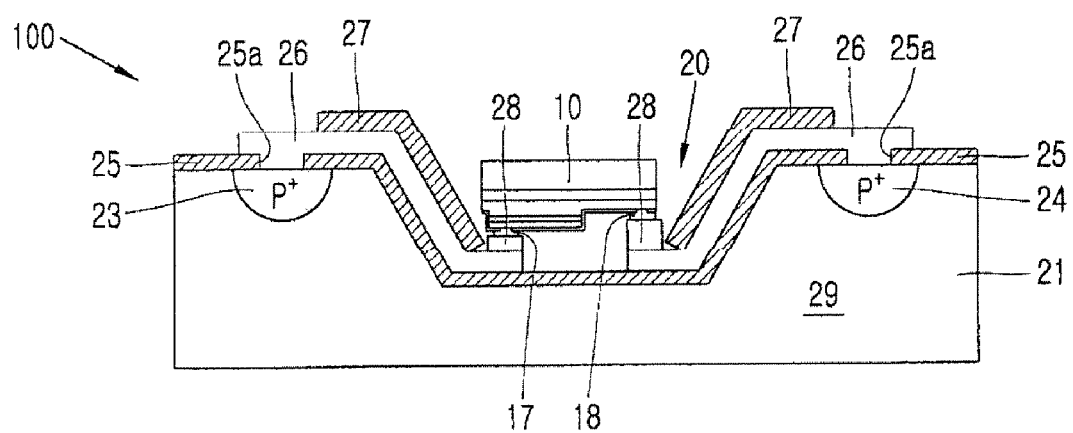
FIG. 2 is a sectional view showing a light emitting device in accordance with a first embodiment of the present invention.

FIG. 2 is a sectional view showing a light emitting device in accordance with a first embodiment of the present invention.

As shown in the drawing, a light emitting device 100 in accordance with a first embodiment of the present invention includes a light emitting element 10 having a first electrode 17 and a second electrode 18 therein, and a semiconductor member 21 having a cavity 20 in its principal surface, inside which the light emitting element 10 is mounted, and electrically connected to the light emitting element 10.

The cavity 20 is preferably formed to be deeper than a height of the light emitting device 10 so that light emitted from the light emitting element 10 does not have influence on other elements and the entire size of the light emitting device 100 can be minimized.

The semiconductor member 21 is made of a silicon material, and acts as a sub-mount for mounting the light emitting element 10 in the cavity which is formed in the principal surface thereof. Furthermore, the semiconductor member 21 has at least two semiconductor regions electrically connected to the first and second electrodes 17 and 18 of the light emitting element 10, respectively, in its principal surface. As a result, the semiconductor member 21 can act as a voltage regulating diode for stabilizing an overvoltage which flows inwardly through an external circuit.

The semiconductor regions are positioned at upper portions of the principal surface where are extended downwardly to each side wall of the cavity 20. That is, the semiconductor regions are formed at parts on the principal surface where the cavity is not formed.

These semiconductor regions include: a first p-type semiconductor diffusion region 23 formed by doping an impurity in a part of the principal surface and thus electrically connected to the first electrode 17, a second p-type semiconductor diffusion region 24 formed by doping the impurity in a part of the principal surface and thus electrically connected to the second electrode 18, and an n-type semiconductor region 29 corresponding to a remaining region of the semiconductor member 21 excluding the first and second p-type semiconductor diffusion regions 23 and 24 therefrom. That is, the semiconductor member 21 can act as a voltage regulating element such as a pnp junction double threshold zener diode.

On the other side, over the entire principal surface of the semiconductor member 21 is formed an insulating layer 25 having contact holes formed therein through which the semiconductor regions 23 and 24 are electrically connected to the first and second electrodes 17 and 18 of the light emitting element 10, respectively. The contact holes are formed in the insulating layer 25 positioned on the principal surface of the semiconductor member 21 which is extended inwardly to the side wall of the cavity 20, and thus each semiconductor region 23 and 24 electrically connected to the first and second electrodes 17 and 18 through the contact holes 25a is exposed to the exterior.

Furthermore, a pair of connection electrodes 26 is provided on the insulating layer 25 so as to electrically connect the semiconductor regions 23 and 24 to the first and second electrodes 17 and 18 of the light emitting element 10, and also to be electrically connected to external components. The pair of connection electrodes 26 is extendedly-formed upwardly from a bottom surface of the cavity 10 to an upper portion of the principal surface along the side wall of the cavity 20. Here, the insulating layer 25 blocks an electrical path between the semiconductor member 21 and the connection electrodes 26.

Thus, the insulating layer 25 is preferably made of one of AlN, ZnO, BeO, silicon oxide and silicon nitride which have a high heat transfer coefficient.

Here, the first and second electrodes 17 and 18 and the pair of connection electrodes 26 are electrically connected, respectively, through installation portions 28 which are formed of a metal material (i.e., An—Sn, In, Pb, Pb—Sn, etc) capable of connecting the connection electrodes and the light emitting element 10 electrically and schematically.

On the other hand, a reflection portion is formed along the side wall of the cavity so as to focus light emitted from the light emitting element 10 and thus increase strength and density of the light. This reflection portion is preferably made of a metal material with a high reflection coefficient such as Al, Ag, or the like.

Figure 13:
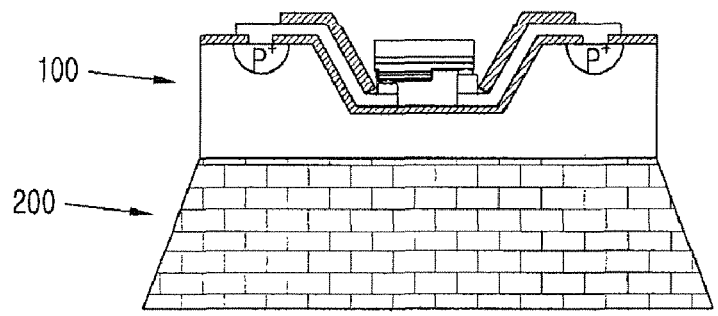
FIG. 13 is a sectional view showing the light emitting device in accordance with the first embodiment of the present invention to which a radiation member is applied.

As can be seen in FIG. 13, a radiation member 200 for transferring heat generated from the light emitting element 10 to the exterior is mounted on an opposite surface to the principal surface of the semiconductor member 2. This radiation member 200 is preferably made of a metal such as copper or iron.

On the other hand, other light emitting elements such as a laser diode (LD) as well as the light emitting diode (LED) illustrated can be applied as the light emitting element 10.

Hereinafter, other embodiments of the present invention will be explained.

Explaining the embodiments of the present invention, the same structure as the aforementioned first embodiment of the present invention and an explanation thereof will be omitted.

Figure 3:
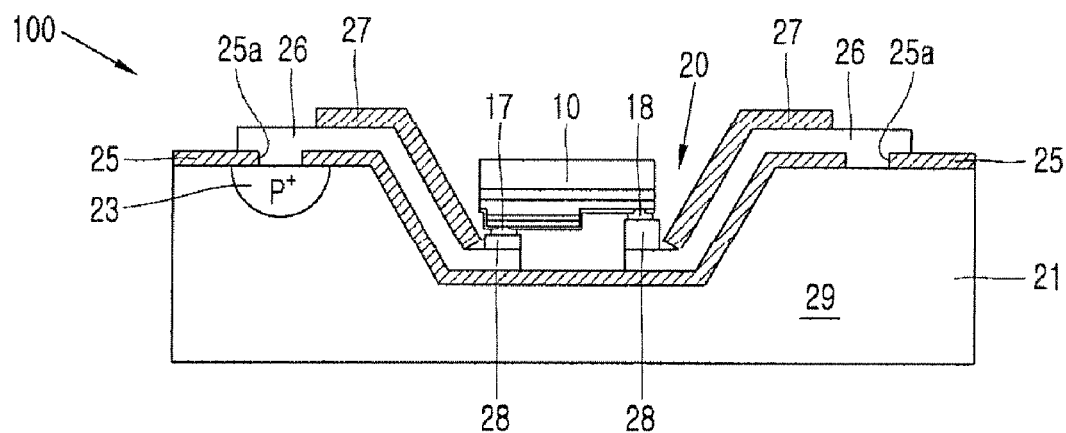
FIG. 3 is a sectional view showing the light emitting device in accordance with a second embodiment of the present invention.

FIG. 3 is a sectional view showing a light emitting device in accordance with a second embodiment of the present invention.

As shown in the drawing, semiconductor regions which are formed on the principal surface of the semiconductor member 21 and electrically connected to the pair of connection electrodes 26 through contact holes 25a of the insulating layer 25 include a p-type semiconductor diffusion region 23 formed by doping an impurity in a part of the principal surface and thus electrically connected to the first electrode 17 of the light emitting element 10; and an n-type semiconductor region 29 corresponding to a remaining region of the semiconductor member 21 excluding the p-type semiconductor diffusion region 23 therefrom, and thus electrically connected to the second electrode 18 of the light emitting element 10. That is, by forming only one region of the semiconductor regions electrically connected to the pair of connection electrodes 26, respectively, as the p-type impurity diffusion region, one of the pair of connection electrodes 26 is formed to be connected to the semiconductor member 21 itself which is made of an n-type silicon material. According to this, the semiconductor member 21 can act as a voltage regulating element such as a pn junction zener diode.

Thus, as shown in the first and second embodiments of the present invention, in order to allow the semiconductor member 21 to act as the voltage regulating diode, the plurality of semiconductor regions electrically connected to the pair of connection electrodes 26 are formed on the principal surface extended to an upper end of the side wall of the cavity 20. However, the semiconductor regions can be formed at a bottom surface of the cavity 20.

Figure 4:
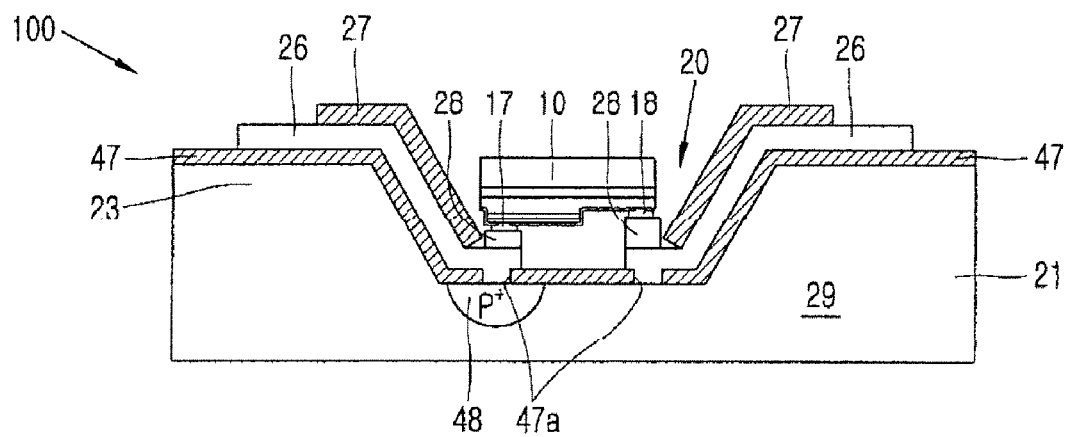
FIG. 4 is a sectional view showing the light emitting device in accordance with a third embodiment of the present invention.

FIG. 4 is a sectional view showing the light emitting device in accordance with a third embodiment of the present invention.

Referring to FIG. 4, the semiconductor regions electrically connected to the pair of connection electrodes 26 through the contact holes 47a of the insulating layer 47 include a p-type semiconductor diffusion region 48 doped in a bottom surface of the cavity 20 to be electrically connected to the first electrode 17 through one of the pair of connection electrodes 26, and an n-type semiconductor region 29 corresponding to a remaining region of the semiconductor member 21 excluding the p-type semiconductor diffusion region 48 therefrom, and electrically connected to the second electrode 18 at the bottom surface of the cavity 20 through the other connection electrode 26. Accordingly, the semiconductor member 21 can act as the voltage regulating element such as a pn junction zener diode.

On the other hand, the semiconductor regions are formed at the bottom surface of the cavity 20, and the contact holes 47a of the insulating layer 47 are formed at the bottom surface of the cavity 20 so as to allow the semiconductor regions to be exposed, respectively. Here, the semiconductor regions 48 and 29 are electrically connected to the light emitting element 10 through the pair of connection electrodes 26 formed to fill up the contact holes 47a.

Figure 5:
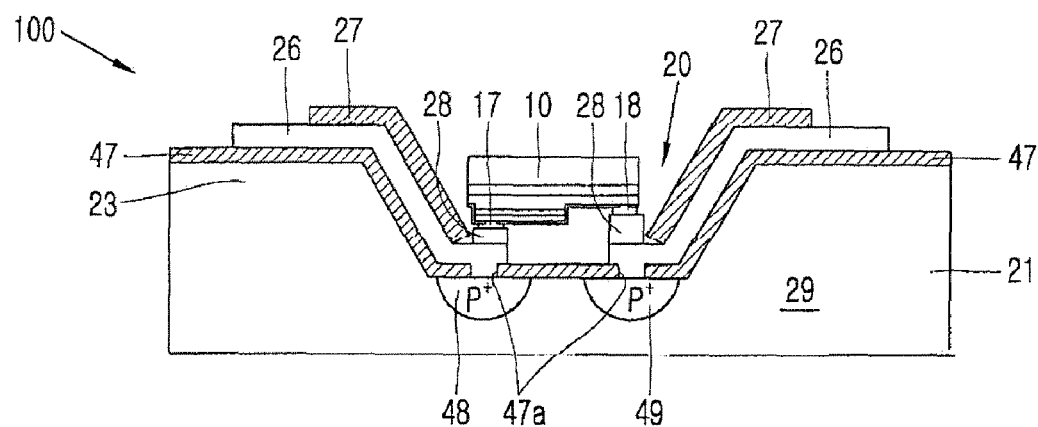
FIG. 5 is a sectional view showing the light emitting device in accordance with a fourth embodiment of the present invention.

FIG. 5 is a sectional view showing the light emitting device in accordance with a fourth embodiment of the present invention. The semiconductor regions provided in the semiconductor member 21 include a first p-type semiconductor diffusion region doped in the bottom surface of the cavity 20 to be electrically connected to the first electrode 17 through one of the pair of connection electrodes 26, a second p-type semiconductor diffusion region 49 doped in the bottom surface of the cavity 20 to be electrically connected to the second electrode 18 through the other connection electrode 26, and an n-type semiconductor region 29 corresponding to a remaining region of the semiconductor member 21 excluding the first and second semiconductor diffusion regions 48 and 49 therefrom. That is, the semiconductor member 21 can act as the voltage regulating element such as a pnp junction double threshold zener diode. As explained in the third embodiment, the contact holes 47a are formed at the insulating layer 47 provided in the bottom surface of the cavity 20 to correspond to the first and second p-type semiconductor regions 48 and 49.

Figure 6:
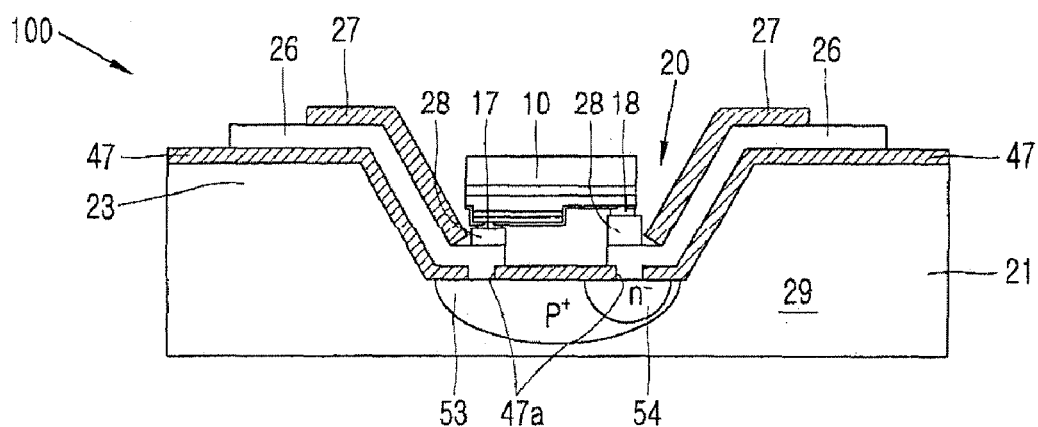
FIG. 6 is a sectional view showing the light emitting device in accordance with a fifth embodiment of the present invention.

FIG. 6 is a sectional view showing a light emitting device in accordance with a fifth embodiment of the present invention. As shown in the drawing, a p-well and an n-well as the plurality of semiconductor regions provided in the semiconductor member are formed at the bottom surface of the cavity.

That is, the semiconductor regions include a p-type semiconductor diffusion region 53 doped in a part of the principal surface of the semiconductor member 21, namely, at the bottom surface of the cavity 20 and thus electrically connected to the first electrode 17, and an n-type semiconductor diffusion region 54 formed by being doped at a part of the p-type semiconductor diffusion region 53 and thus electrically connected to the second electrode 18.

Although not shown in the drawing, the method for constructing the semiconductor regions having the p-well and the n-well therein in the semiconductor member 21, as shown in the first and second embodiments of the present invention, can be embodied even at an upper portion of the principal surface of the semiconductor member 21 extended to an upper end of the side surface of the cavity 20. By constructing these p-well and n-well, the semiconductor member 21 can act as the voltage regulating element such as a pn junction zener diode.

When the semiconductor member 21 is constructed as the pn junction voltage regulating diode, on the other hand, the voltage regulating diode and the light emitting element 10 must be electrically connected thereto in parallel, and the voltage regulating diode and the light emitting element 10 must be electrically connected to counter electrodes therefrom.

Hereinafter, a fabrication method for the light emitting device will be explained in accordance with the first embodiment of the plurality of embodiments of the present invention.

FIGS. 7 to 12 show procedures of fabricating the light emitting device according to the first embodiment of the present invention.

The light emitting element to be used here, as aforementioned, can be the light emitting diode or the laser diode. A fabrication process which will be explained is performed by a batch process on a silicon wafer.

Figure 11:
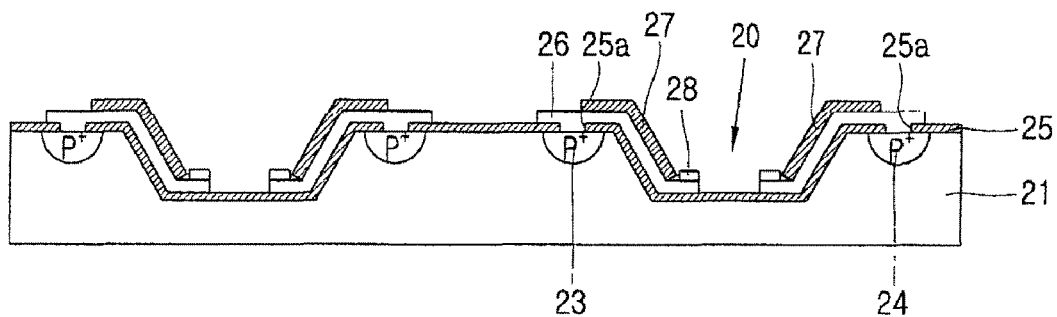
Figure 12:
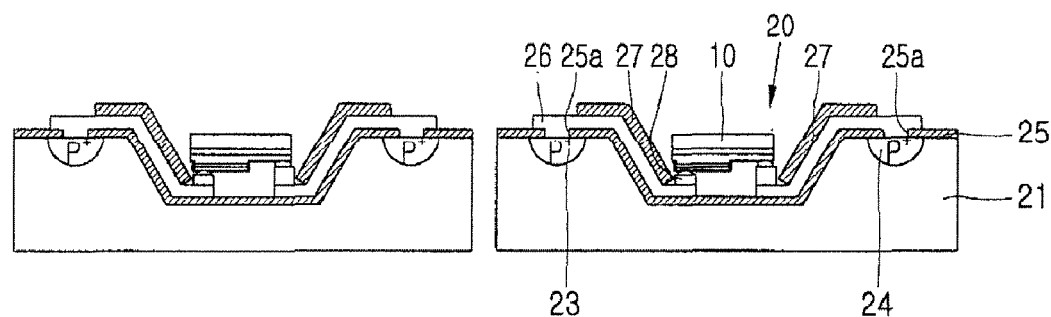

As shown in the drawings, a fabrication method for a light emitting device according to the first embodiment of the present invention includes the steps of forming a cavity in a principal surface of a semiconductor substrate (FIGS. 7 and 8), forming at least one impurity diffusion region on the principal surface to thereby form a plurality of semiconductor regions (FIG. 9), forming an insulating layer over the principal surface and patterning contact holes at parts of the insulating layer so as to expose two regions of the plurality of semiconductor regions (FIG. 10), forming a pair of connection electrodes extended upwardly from a bottom surface of the cavity to an upper portion of the principal surface along the side wall of the cavity to fill up the contact holes, for electrically connecting the two exposed semiconductor regions with a light emitting element to be mounted later and also to be electrically connected to external components (FIG. 11), and connecting the light emitting element to the pair of connection electrodes so as to position the light emitting element inside the cavity (FIG. 12).

The fabrication method will be described in more detail as follows.

Figure 7:
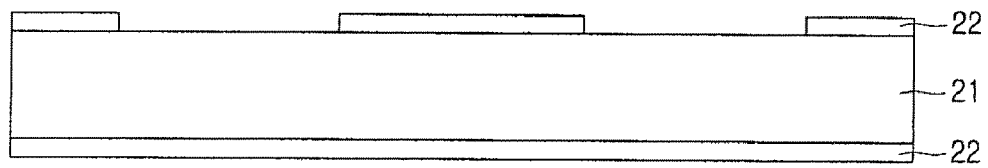
FIGS. 7 to 12 show procedures of fabricating the light emitting device in accordance with the first embodiment of the present invention.

First, as shown in FIG. 7, a mask layer 22 to be used during a wet etching performed is formed by such a chemical vapor deposition (CVD) method at both surfaces of a semiconductor substrate 21 made of a silicon material which is thicker than a height of a light emitting element to be joined later. Thereafter, the mask layer 22 is patterned so as to expose parts of the principal surface of the semiconductor substrate 21 by using a lithography process and the etching process.

Figure 8:
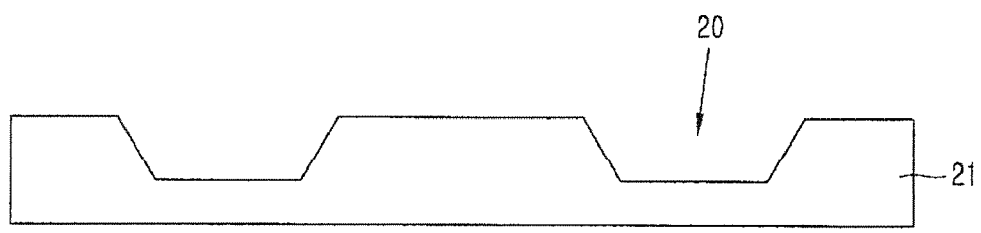

Afterwards, as shown in FIG. 8, a cavity 20 is formed in the principal surface of the semiconductor substrate 21 having exposed by the patterning of the mask layer 22 by a bulk micro-machining technique using the wet etching. While this, the cavity must be formed to be deeper than the height of the light emitting element 10 which will be joined thereto such that the light emitting element 10 to be positioned in the cavity in later processes is protected from an interference with other adjacent elements and heat generated from the light emitting element is easily diffused to the exterior by making a thin bottom surface of the cavity 20, in which the light emitting element 10 is mounted.

Figure 9:
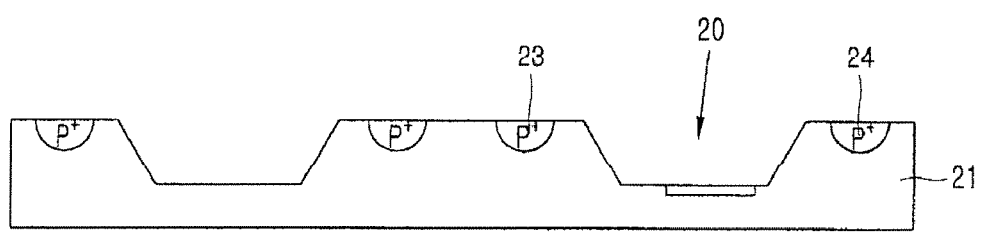

As shown in FIG. 9, then, a first p-type impurity diffusion region 23 and a second p-type impurity diffusion region 24 are formed on the principal surface extended to an upper end of the side wall of the cavity 20 so as to allow the semiconductor substrate 21 to act as a voltage regulating diode.

Figure 10:
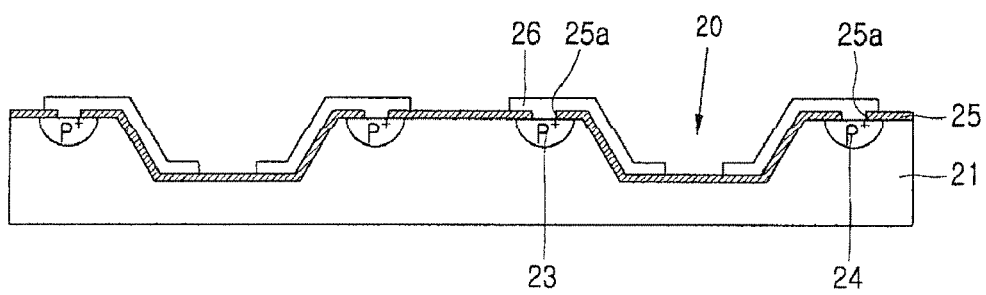

Next, as shown in FIG. 10, an insulating layer 25 is formed over the entire principal surface of the semiconductor substrate 21 having the cavity 20 formed thereon. Parts of the insulating layer 25 are then etched to form contact holes 25a, thereby partially exposing the first and second p-type impurity diffusion regions 23 and 24. Thereafter, a pair of connection electrodes 26 is patterned on the insulating layer 25 so as to be electrically connected to the first and second p-type impurity diffusion regions 23 and 24 and to be also extended upwardly from the bottom surface of the cavity 20 along the side wall thereof. The connection electrodes 26, as shown in FIG. 10, are extended upwardly onto the principal surface of the semiconductor substrate 21. As a result, the connection electrodes 26 allow each electrode 17 and 18 of the light emitting element, which will be joined later, to be electrically connected to the first and second p-type impurity diffusion regions 23 and 24 and also act as connection pads to be connected to external circuits.

Here, the insulating layer 25 may be formed of one of AlN, ZnO, or BeO by using a thin film deposition method such as a sputtering process or a evaporation process. Meanwhile, the insulating layer 25 may be formed as an insulating film such as a silicon oxide film or a silicon nitride film.

Furthermore, the pair of connection electrodes 26 is preferably patterned by using a lift-off process after forming a metal layer on the insulating layer 25, and can be patterned by using a metal layer etching process.

Next, as shown in FIG. 11, reflection portions 27 made of a metal having a high reflection coefficient are formed on the connection electrodes 26, respectively, along the side wall of the cavity 20. Installation portions 28 for mounting the light emitting element thereon are formed at parts of the connection electrodes 26 positioned at the bottom surface of the cavity 20.

The reflection portion 27 may not be formed when the connection electrodes 26a are formed of the metal having the high reflection coefficient. However, it is preferred to form the separate reflection portion 27 so as to more efficiently condense light discharged from the light emitting element 10.

In addition, the installation portion 18 is preferably formed by a lift-off process, and can be made of any metal which can connect the connection electrodes 26 and the light emitting element 10, such as An—Sn, In, Pb, Pn—Sn, or the like.

Next, as shown in FIG. 12, the plurality of structures formed on the silicon wafer is separated as a single chip by a dicing process. Thereafter, the light emitting element 10 is joined into the installation portions 28 formed on the connection electrodes 26 in the cavity 20 by a flip-chip bonding method. Through those processes, a light emitting device 100 in accordance with the first embodiment of the present invention is fabricated.

Hereinafter, a fabrication method for a light emitting device in accordance with second to fifth embodiments of the present invention will be explained, and the same part as the fabrication method for the light emitting device in accordance with the first embodiment will be omitted.

In the fabrication method for the light emitting device according to the second embodiment, when forming the plurality semiconductor regions, only one p-type impurity diffusion region 23 is formed on the principal surface extended to an upper end of the side wall of the cavity 20. Thus, when exposing the two semiconductor regions, a part of the p-type impurity diffusion region 23 and a part of the n-type semiconductor substrate 21 made of the silicon material are exposed on the principal surface, thereby patterning the contact holes 25a of the insulating layer 25.

Furthermore, in the fabrication method for the light emitting device in accordance with the third embodiment, when forming the plurality of semiconductor regions, only one p-type impurity diffusion region is formed at the bottom surface of the cavity 20. Therefore, when exposing the two semiconductor regions, contact holes 47a of an insulating layer 47 are patterned so as to expose a part of the p-type impurity diffusion region and a part of the n-type semiconductor substrate 21 at the bottom surface of the cavity 20.

In the fabrication method for the light emitting device according to the fourth embodiment, on the other hand, when forming the plurality of semiconductor regions, a first p-type impurity diffusion region 48 and a second p-type impurity diffusion region 49 are formed at the bottom surface of the cavity 20, respectively. Therefore, when exposing the two semiconductor regions, contact holes 25a of an insulating layer 25 are patterned so as to expose the first p-type impurity diffusion region 48 and the second p-type impurity diffusion region 49, respectively, at the bottom surface of the cavity 20.

In the fabrication method for the light emitting device according to the fifth embodiment, when forming the plurality of semiconductor regions, a p-type impurity diffusion region 53 and an n-type impurity diffusion region 54 doped in a part of the p-type impurity diffusion region 53 are formed at the bottom surface of the cavity, respectively. Therefore, when exposing the two semiconductor regions, contact holes 47a of the insulating layer 47 are patterned so as to expose the p-type impurity diffusion region 53 and the n-type impurity diffusion region 54, respectively, at the bottom surface of the cavity.

In addition, using the same method as the fabrication method of the fifth embodiment, the p-type impurity diffusion region and the n-type impurity diffusion region doped in a part of the p-type impurity diffusion region can be formed on the principal surface of the semiconductor substrate extended to the upper end of the side wall of the cavity.

FIG. 13, on the other side, shows a radiation member 200 mounted at a lower portion of the light emitting device 100 fabricated by such processes, namely, at an opposite surface to the principal surface of the semiconductor substrate 21 having the light emitting element 10 mounted thereon. As shown in the drawing, because the semiconductor substrate 21 between the radiation member 200 and the light emitting element 10, namely, the bottom surface portion of the cavity 20 is thin, heat generated by an operation of the light emitting element 10 is facilitated to be diffused to the exterior through the semiconductor substrate and the radiation member 200, thereby preventing deterioration of the light emitting device 100.

Figure 14:
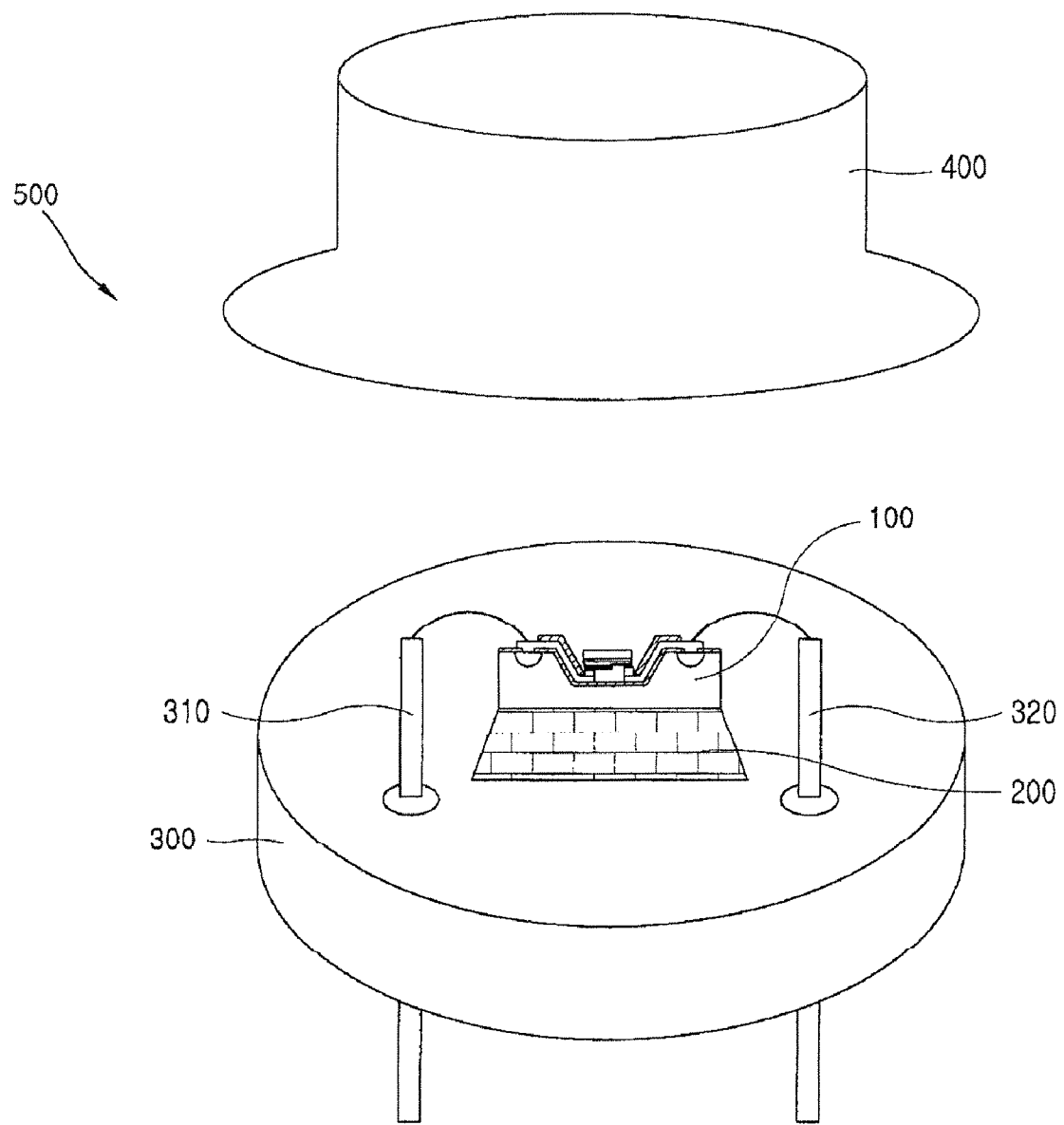
FIG. 14 is an exploded perspective view showing a light emitting system to which the light emitting device in accordance with the first embodiment of the present invention is applied.

FIG. 14 shows a structure which a light emitting system having the light emitting device therein according to the embodiment of the present invention is applied to an optical communication device 500, especially, a TO-can frequently used as a package of a photoelectron element.

As shown in FIG. 14, a light emitting system 500 to which the light emitting device is applied includes the aforementioned light emitting device 100 having the radiation member 200 mounted therein, a stem portion 300 having the light emitting device 100 mounted therein and a pair of lead frames 310 and 320 electrically connected to the connection electrodes 26, and a cap portion 400 for covering the stem portion 300 to seal the light emitting device 100.

That is, the radiation member 200 having the light emitting device 100 mounted therein is joined with the stem portion 300 with a high heat transfer efficiency by using such boning agent, and thereafter, the lead frame 310 and 320 formed on the stem portion 300 are electrically connected in the exterior to the connection electrodes 26 exposed on the light emitting device 100 by using a wire bonding technique. The cap portion 400 having a transparent window (not shown) made of lens (not shown) or quartz then covers and packs the light emitting device 100 and the wire connected, in order to protect the light emitting device 100 and the wire connected thereto by the wire bonding technique. As a result, the light emitting system 500 to which the light emitting device according to the present invention is employed is achieved.

As described so far, in the light emitting device according to the present invention, by forming a cavity having a depth which is deeper than the height of the light emitting element in the principal surface of the semiconductor substrate and forming at least two semiconductor regions including impurity diffusion regions to be electrically connected to two electrodes of the light emitting element on the principal surface of the semiconductor substrate, the semiconductor substrate can act as a voltage regulating diode for protecting the light emitting element from an static electricity or a surge voltage flowed inwardly from the exterior through the connection electrodes. In addition to this, because the light emitting element is mounted in the cavity, an entire size of the light emitting device can be very compact.

Furthermore, since light emitted from the light emitting element can be condensed more effectively by forming the reflection portions on each side wall of the cavity where the light emitting element is positioned, efficiency of light output can be improved.

Because of enabling the cavity where the light emitting element is mounted to have a thin bottom surface, heat generated from the light emitting element can easily be discharged to the exterior through the semiconductor substrate of a silicon material with a high heat transfer coefficient and a radiation member joined thereinto.

In addition, the light emitting device according to the present invention can be fabricated as a single chip on a silicon wafer by using a micro-machining technique. As a result, a producing cost thereof can be reduced and a mass production can be facilitated.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A light emitting device comprising:
   a light emitting element having a first electrode and a second electrode; and
   a semiconductor member having a cavity in a principal surface, inside which the light emitting element is mounted,
   wherein the semiconductor member is a voltage regulating diode having at least two regions, and the at least two regions comprise:
   a first semiconductor diffusion region formed in a part of the principal surface, and electrically connected to the first electrode; and
   a second semiconductor diffusion region formed in a part of the first semiconductor diffusion region, and electrically connected to the second electrode.

2. The device of claim 1, wherein the first semiconductor diffusion region comprises a p-type semiconductor diffusion region formed by being doped in a part of the principal surface, and the second semiconductor diffusion region comprises an n-type semiconductor diffusion region formed by being doped in a part of the p-type semiconductor diffusion region.

3. The device of claim 1, wherein the first and second semiconductor diffusion regions are formed at a bottom surface of the cavity.

4. The device of claim 1, wherein a reflection portion is formed along a side wall of the cavity so as to condense light emitted from the light emitting element.

5. The device of claim 1, wherein a depth of the cavity is deeper than a height of the light emitting element mounted in the cavity.

6. The device of claim 1, wherein the voltage regulating diode and the light emitting element are electrically connected in parallel.

7. The device of claim 1, wherein the voltage regulating diode and the light emitting element are electrically connected to counter electrodes thereof.

8. The device of claim 1, wherein the voltage regulating diode is configured to act as a voltage regulating diode.

9. The device of claim 1, wherein a radiation member is mounted in an opposite surface to the principal surface of the semiconductor member so as to externally transfer heat generated from the light emitting element.

10. The device of claim 1, wherein an entire principal surface is provided with an insulating layer having contact holes formed therein to electrically connect the first and second semiconductor diffusion regions, respectively, to the first and second electrodes.

11. The device of claim 10, wherein the contact holes are formed in the insulating layer positioned at a bottom surface of the cavity, and the first and second semiconductor diffusion regions are exposed through the contact holes.

12. The device of claim 10, wherein a pair of connection electrodes is formed on the insulating layer so as to electrically connect the first and second semiconductor diffusion regions to the first and second electrodes, respectively, and to be electrically connected to external components.

13. The device of claim 12, wherein the pair of connection electrodes is extended from a bottom surface of the cavity to the principal surface upwardly along a side wall of the cavity.

14. The device of claim 12, wherein the first and second electrodes are electrically connected to the pair of connection electrodes through installation portions positioned therebetween.

15. A light emitting device comprising:
    a light emitting element having a first electrode and a second electrode; and
    a semiconductor member having a cavity in a principal surface, inside which the light emitting element is mounted,
    wherein the semiconductor member is a voltage regulating diode for protecting the light emitting element from an electricity or a voltage flowed inwardly from an exterior, and the voltage regulating diode has at least two regions,
    wherein the at least two regions comprise:
    a first semiconductor diffusion region formed in a part of the principal surface, and electrically connected to the first electrode; and
    a second semiconductor diffusion region formed in a part of the first semiconductor region, and electrically connected to the second electrode.

16. The device of claim 15, wherein the first semiconductor diffusion region comprises a p-type semiconductor diffusion region formed by being doped in a part of the principal surface, and the second semiconductor diffusion region comprises an n-type semiconductor diffusion region formed by being doped in a part of the p-type semiconductor diffusion region.

17. The device of claim 15, wherein the first and second semiconductor diffusion regions are formed at a bottom surface of the cavity.

18. The device of claim 15, wherein a reflection portion is formed along a side wall of the cavity so as to condense light emitted from the light emitting element.

19. The device of claim 15, wherein an entire principal surface is provided with an insulating layer having contact holes formed therein to electrically connect the first and second semiconductor diffusion regions, respectively, to the first and second electrodes.

20. The device of claim 19, wherein the contact holes are formed in the insulating layer positioned at a bottom surface of the cavity, and the first and second semiconductor diffusion regions are exposed through the contact holes.

* * * * *